(12) United States Patent
Kim

(10) Patent No.: US 7,525,359 B2
(45) Date of Patent: Apr. 28, 2009

(54) DUTY CYCLE CORRECTION AMPLIFICATION CIRCUIT

(75) Inventor: Yang Ki Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 11/527,381

(22) Filed: Sep. 27, 2006

(65) Prior Publication Data

US 2007/0132494 A1    Jun. 14, 2007

(30) Foreign Application Priority Data

Dec. 13, 2005    (KR)    ............... 10-2005-0122488

(51) Int. Cl.
*H03K 3/017*    (2006.01)
(52) U.S. Cl. ...................... 327/175; 327/172
(58) Field of Classification Search .............. None
See application file for complete search history.

(56) References Cited

U.S. PATENT DOCUMENTS

| | | | | |
|---|---|---|---|---|
| 5,572,158 A * | 11/1996 | Lee et al. | .................. | 327/175 |
| 5,945,857 A * | 8/1999 | Havens | .................. | 327/175 |
| 6,169,434 B1 * | 1/2001 | Portmann | .................. | 327/175 |
| 6,411,145 B1 * | 6/2002 | Kueng et al. | .................. | 327/175 |
| 6,819,155 B1 | 11/2004 | Ling et al. | | |
| 6,975,100 B2 * | 12/2005 | Doppke et al. | .................. | 323/288 |
| 6,975,150 B2 * | 12/2005 | Panikkath et al. | .................. | 327/175 |
| 7,088,160 B2 * | 8/2006 | Harms et al. | .................. | 327/175 |
| 7,180,346 B2 * | 2/2007 | Lee | .................. | 327/175 |
| 7,202,722 B2 * | 4/2007 | Mahadevan et al. | .................. | 327/175 |
| 7,203,860 B2 * | 4/2007 | Ishida et al. | .................. | 713/503 |

FOREIGN PATENT DOCUMENTS

| | | |
|---|---|---|
| JP | 07106927 A | 4/1995 |
| KR | 1020040064862 | 7/2004 |
| KR | 1020050040551 | 5/2005 |

* cited by examiner

*Primary Examiner*—Cassandra Cox
(74) *Attorney, Agent, or Firm*—Volentine & Whitt, PLLC

(57) ABSTRACT

A duty cycle correction amplification circuit is disclosed and comprises a first amplifier comprising dual first MOS differential input transistors gated respectively by first and second reference signals, and adapted to generate first and second preliminary signals, a second amplifier comprising dual second MOS differential input transistors respectively gated by first and second preliminary signals and adapted to generate first and second internal signals, and a duty cycle corrector adapted to correct a duty cycle associated with the first and second internal signals, wherein one of the first and second internal signals comprises an amplified output signal having a corrected duty cycle.

19 Claims, 5 Drawing Sheets

DUTY CYCLE CORRECTION AMPLIFICATION CIRCUIT

BACKGROUND OF THE INVENTION

1. Field of the Invention

Embodiments of the invention relate to amplification circuits adapted for use in semiconductor devices. More particularly, embodiments of the invention relate to a duty cycle correction amplification circuit.

This application claims priority to Korean Patent Application No. 2005-122488 filed Dec. 13, 2005, the subject matter of which is hereby incorporated by reference.

2. Description of the Related Art

Various types of amplification circuits are routinely used in semiconductor devices. Generally speaking, an amplification circuit outputs an amplified signal corresponding to an input reference signal. Many of the signals subjected to amplification in a semiconductor device are periodic in nature and characterized by co-called duty cycle. "Duty cycle" is a well known term and generally defines a ration between "ON time" and "OFF time" for a particular signal. ON time, for example, may be defined as a period during which the signal is in a logically high state. The duty cycle of a signal is an important performance characteristic, and related circuit operation is often defined in relation to it. Unfortunately, the duty cycle of a signal may become distorted by numerous factors.

As a result, conventional amplification circuits have been developed that correct duty cycle distortion as well as amplify the signal. For purposes of this description, an amplification circuit having a duty cycle correction capability will be referred to as a "duty cycle correction amplification circuit".

FIG. (FIG.) 1 is a circuit diagram illustrating a conventional duty cycle correction amplification circuit. The duty cycle correction amplification circuit of FIG. 1 includes a first amplifier 10, a second amplifier 20, and a duty cycle corrector 30. First amplifier 10 generates first and second preliminary signals VPRE and VPREB corresponding to received first and second reference signals VREF and VREFB. Second amplifier 20 generates an amplified output signal VOUT based on the first and second preliminary signals VPRE and VPREB. The output signal VOUT is buffered by a buffer 40, which may be implemented using an inverter. The amplified signal output from buffer 40 is termed VAMP. Duty cycle corrector 30 adjusts current supplied to the first and second preliminary signals VPRE and VPREB, thus correcting the duty cycle of the output signal VOUT, and ultimately, the duty cycle of amplified signal VAMP.

In the conventional duty cycle correction amplification circuit of FIG. 1, duty cycle corrector 30 is connected to the first and second preliminary signals VPRE and VPREB. In this configuration, current flows from the first and second preliminary signals VPRE and VPREB to duty cycle corrector 30 to correct the duty cycle of the amplified signal VAMP. Due to this current flow, the voltage levels of the first and second preliminary signals VPRE and VPREB may be reduced. As a result, the voltage margin for proper operation (e.g., within a defined saturation region) of NMOS differential input transistors 11 and 13 may be impaired and the amplification factor of the circuit decreased accordingly. Further, the operating speed of the duty cycle correction amplification circuit may decrease, since it becomes increasingly difficult to operate the duty cycle correction amplification circuit at lower voltages. Still further, due to the load capacitance of duty cycle corrector 30, the frequency characteristics of the amplified signal may deteriorate.

Consequently, the conventional duty cycle correction amplification circuit is problematic in that the amplification factor and operating speed of the circuit may be impaired under certain operating conditions.

SUMMARY OF THE INVENTION

Embodiments of the invention provide a duty cycle correction amplification circuit adapted to maintain a desired amplification factor and operating speed.

In one embodiment, the invention provides a duty cycle correction amplification circuit, comprising; a first amplifier comprising dual first MOS differential input transistors gated respectively by first and second reference signals, and adapted to generate first and second preliminary signals, a second amplifier comprising dual second MOS differential input transistors respectively gated by first and second preliminary signals and adapted to generate first and second internal signals, and a duty cycle corrector adapted to correct a duty cycle associated with the first and second internal signals, wherein one of the first and second internal signals comprises an amplified output signal having a corrected duty cycle.

In another embodiment, the invention provides a duty cycle correction amplification circuit, comprising; series connected first and second amplifiers, each comprising dual MOS differential input transistors, and collectively adapted to generate first and second internal signals defining an amplified output signal in response to received first and second reference signals, and a duty cycle corrector connected in series with the second amplifier, adapted to act as a load for the first and second internal signals, and further adapted to correct the duty cycle of the amplified output signal.

DESCRIPTION OF EXEMPLARY EMBODIMENTS

Figure 1:
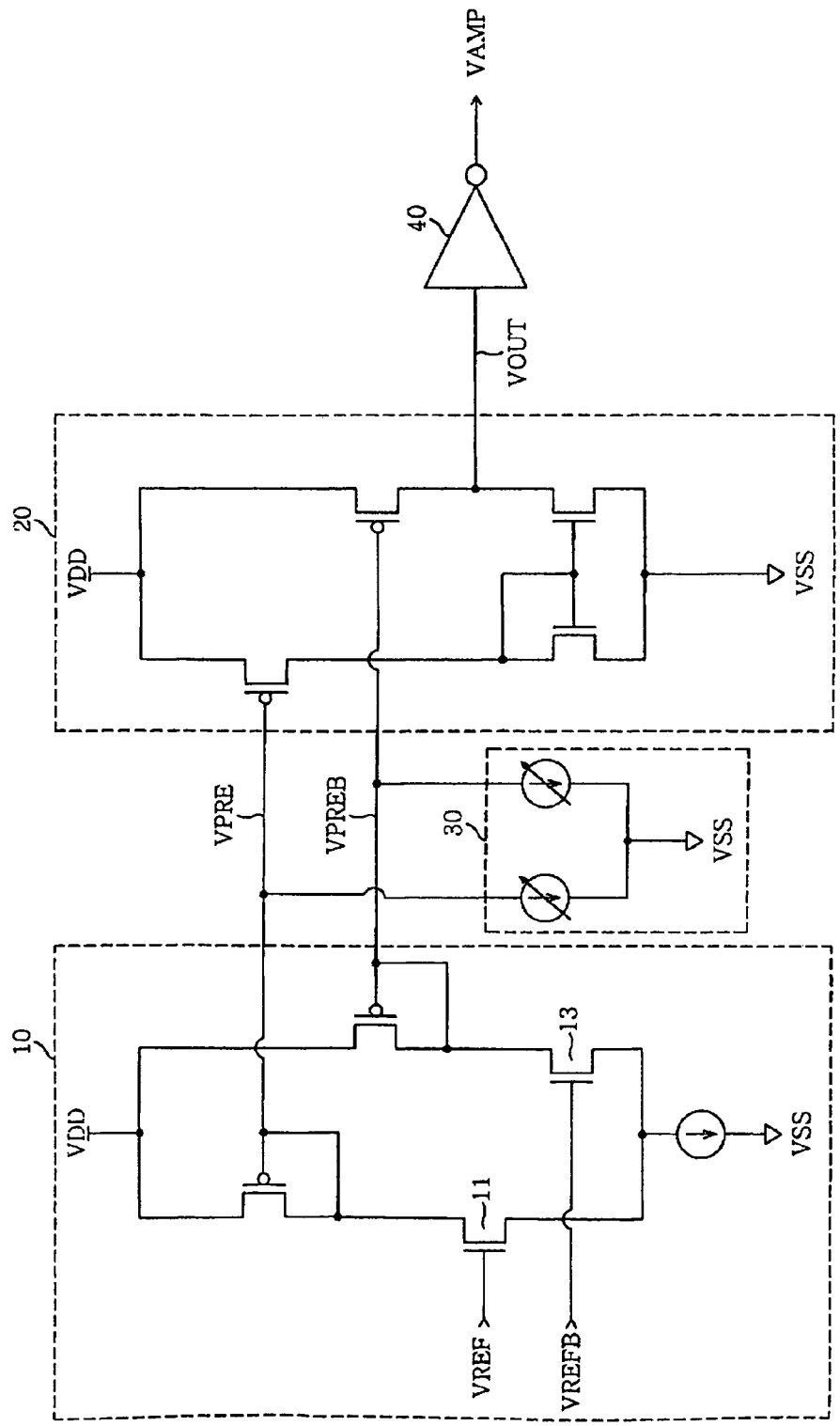
FIG. 1 is a circuit diagram illustrating a conventional duty cycle correction amplification circuit.

Several embodiments of the invention will now be described with reference to the accompanying drawings, in which similar reference numerals are used to designate the similar components.

Figure 2:
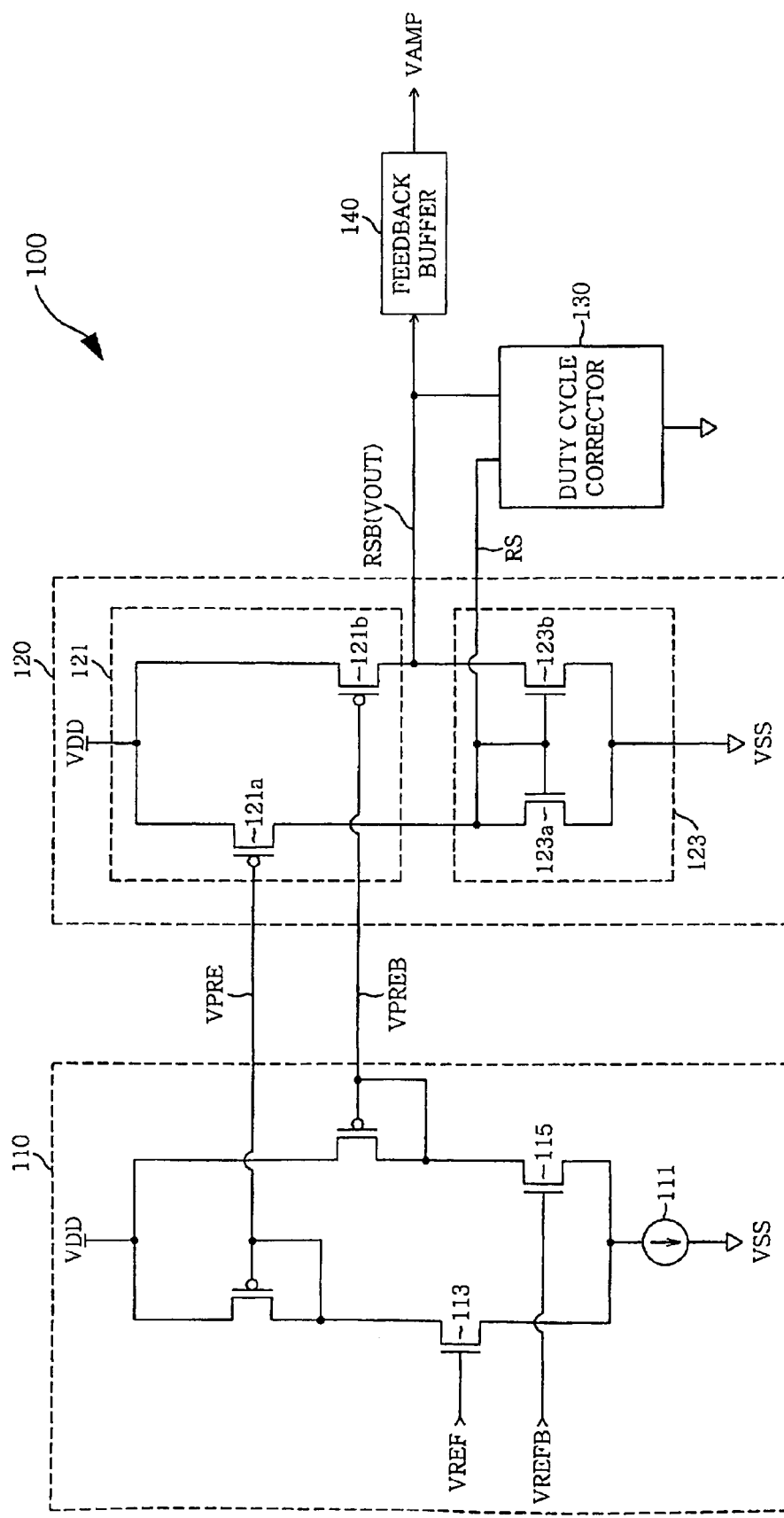
FIG. 2 is a circuit diagram of a duty cycle correction amplification circuit according to an embodiment of the present invention.

FIG. 2 is a circuit diagram of an exemplary duty cycle correction amplification circuit 100 according to an embodiment of the present invention. Duty cycle correction amplification circuit 100 amplifies received first and second reference signals VREF and VREFB, and generating a corresponding amplified signal VAMP. The duty cycle of the amplified signal VAMP is corrected during the amplification process.

Referring to FIG. 2, duty cycle correction amplification circuit 100 comprises a first amplifier 110, a second amplifier 120 and a duty cycle corrector 130. First amplifier 110 generates first and second preliminary signals VPRE and VPREB, which respond to the first and second reference signals VREF and VREFB, respectively. In the illustrated embodiment, first amplifier 110 comprises NMOS differential (first) input transistors 113 and 115 connected to a current source 111. Further, NMOS differential input transistors 113 and 115 are gated by the first and second reference signals VREF and VREFB. Subsequently, the first and second preliminary signals VPRE and VPREB, generated by first amplifier 110 are output through the drain terminals of the NMOS differential input transistors 113 and 115. The voltage biasing of input transistors 113 and 115 is conventional and will not therefore be discussed in detail.

Second amplifier 120 generates an amplified output signal VOUT corresponding to the first and second preliminary signals VPRE and VPREB. Further, the output signal VOUT of second amplifier 120 is used to ultimately generate the amplified signal VAMP.

In the illustrated embodiment, second amplifier 120 comprises a driving unit 121 and a load unit 123. Driving unit 121 generates first and second internal signals RS and RSB in response to the first and second preliminary signals VPRE and VPREB. Second internal signal RSB functions as the output signal VOUT of second amplifier 120.

Further, load unit 123 is connected to driving unit 121, receives the first and second internal signals RS and RSB, and acts as a load to the first and second internal signals RS and RSB.

In the illustrated embodiment, driving unit 121 comprises PMOS differential (second) input transistors 121a and 121b connected to a supply voltage VDD. Further, PMOS differential input transistors 121a and 121b are gated by the first and second preliminary signals VPRE and VPREB, respectively. Therefore, the first and second internal signals RS and RSB, generated by driving unit 121, are amplified with respect to the received first and second preliminary signals VPRE and VPREB, respectively.

Consequently, the output signal VOUT of second amplifier 120 is amplified with respect to the first and second preliminary signals VPRE and VPREB, and ultimately, the first and second reference signals VREF and VREFB.

Duty cycle corrector 130 supplies variable current to the first and second internal signals RS and RSB. By adjusting the amount of supplied current using duty cycle corrector 130, the duty cycle of the output signal VOUT of second amplifier 120, and ultimately, the amplified signal VAMP, is corrected.

In the illustrated embodiment, duty cycle corrector 130 is connected to the first and second internal signals RS and RSB. Therefore, the voltage levels of the first and second preliminary signals VPRE and VPREB are maintained at higher levels than those of conventional duty cycle correction amplification circuits. As a result, the operation of NMOS differential input transistors 113 and 115 in a defined saturation region is better provided. Therefore, in a duty cycle correction amplification circuit consistent with embodiments of the present invention, the operating characteristics of first amplifier 110 at a low voltage are improved, and the load capacitance of the first and second preliminary signals VPRE and VPREB is decreased, thus improving the overall operating characteristics of the duty cycle correction amplification circuit.

Figure 3:
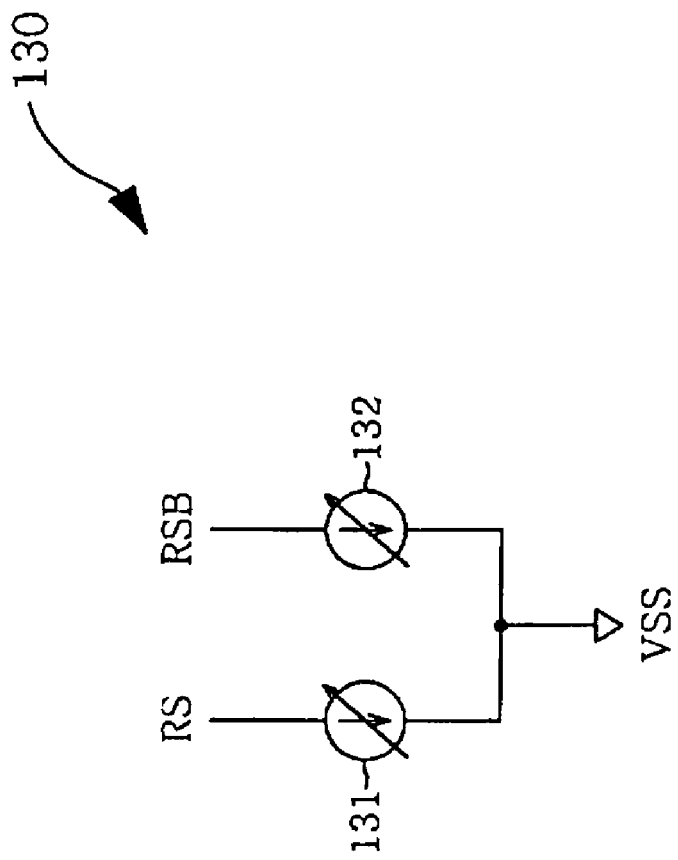
FIG. 3 is a diagram of an example of the duty cycle corrector of FIG. 2.

FIG. 3 is a circuit diagram illustrating an exemplary duty cycle corrector 130 adapted for use within the circuit of FIG. 2. Referring to FIG. 3, duty cycle corrector 130 comprises first and second variable current sources 131 and 132. First and second variable current sources 131 and 132 supply predetermined currents to the first and second internal signals RS and RSB, respectively. The current supplied to the first or second internal signal RS or RSB by first or second variable current source 131 or 132 may be adjusted to correct the duty cycle of the amplified signal VAMP.

Referring again to FIG. 2, duty cycle correction amplification circuit 100 may further comprise a feedback buffer 140. Feedback buffer 140 buffers the output signal VOUT of second amplifier 120 and generates the amplified signal VAMP. In this case, the output signal VOUT of second amplifier 120 is coupled to the amplified signal VAMP.

The slope of the amplified signal VAMP appearing during a pull-up or pull-down operation is improved in this way through the coupling of the output signal VOUT of second amplifier 120 to the amplified signal VAMP. Further, the DC voltage level of the amplified signal VAMP is promptly set.

Figure 4:
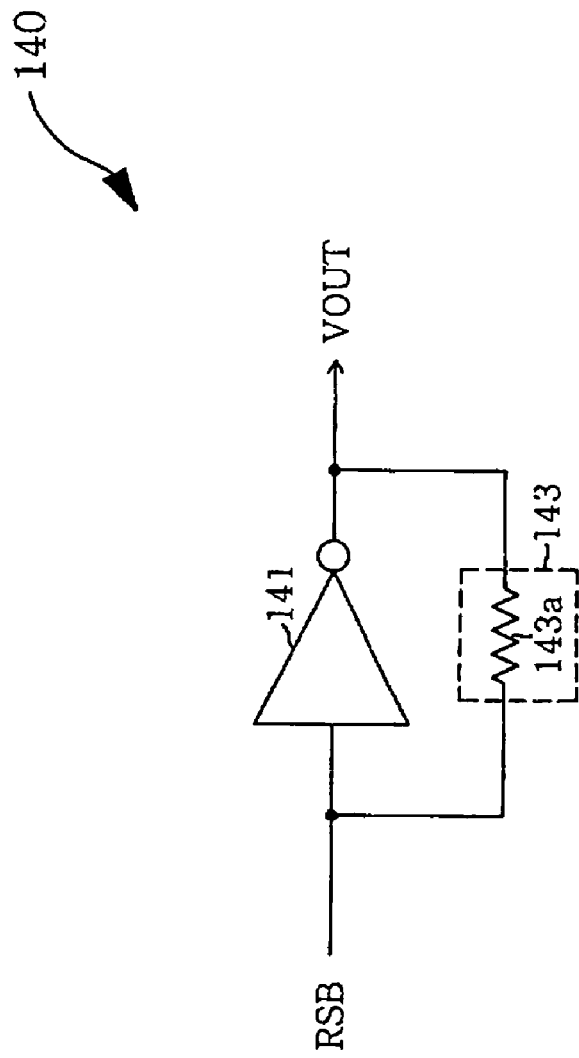
FIG. 4 is a diagram of an example of the feedback buffer of FIG. 2.

FIG. 4 is a circuit diagram showing an exemplary feedback buffer 140 adapted for use within the circuit of FIG. 2. Referring to FIG. 4, feedback buffer 140 comprises a buffering component 141 and a coupling component 143. Buffering component 141 buffers the output signal VOUT of second amplifier 120, and generates the amplified signal VAMP. In one embodiment, buffering component 141 is an inverter.

Coupling component 143 feedback couples the amplified signal VAMP to the output signal VOUT of second amplifier 120 and thus the input of buffering component 141. In one embodiment, coupling component 143 comprises a resistor 143a connected between the amplified signal VAMP and the output signal VOUT of second amplifier 120.

Figure 5:
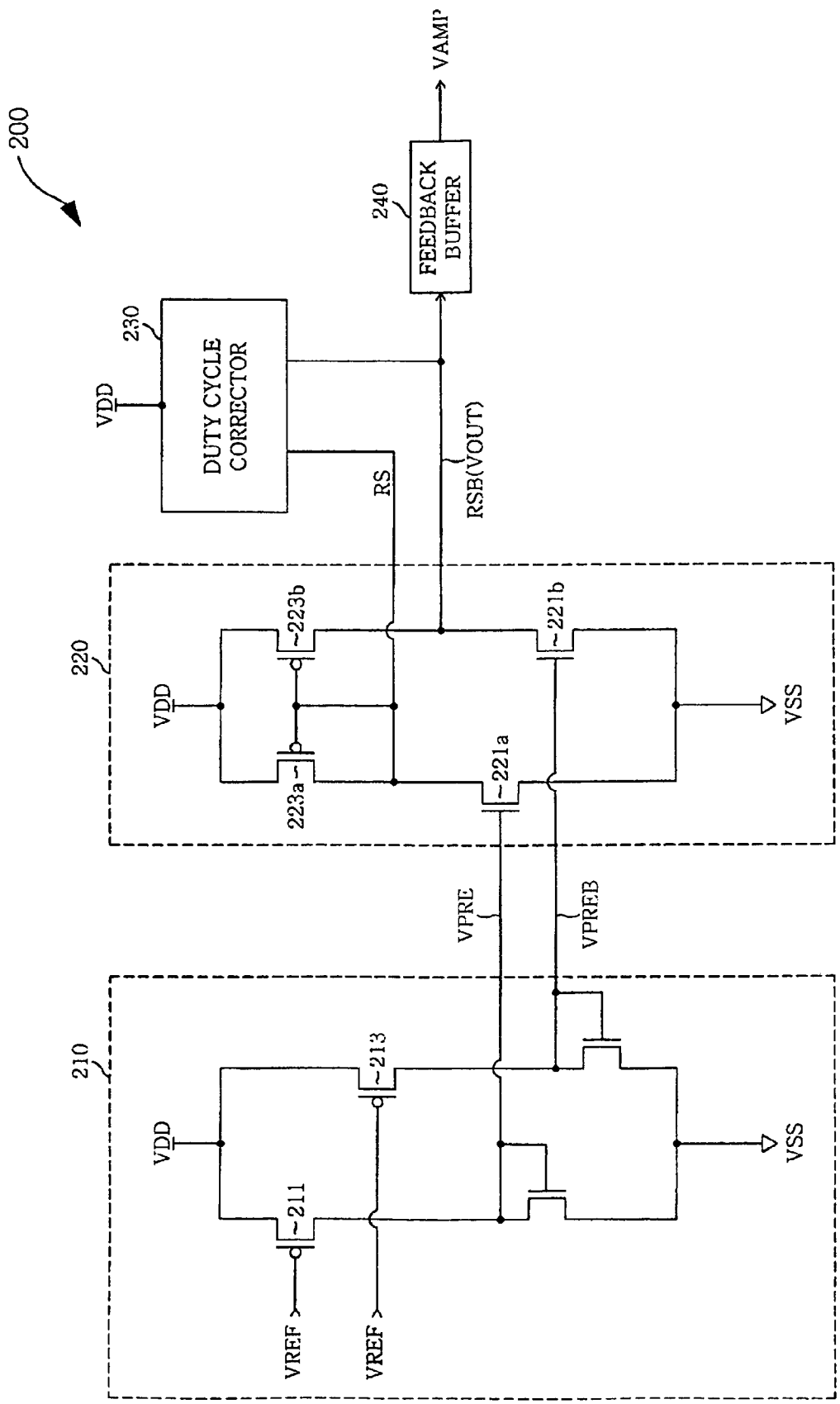
FIG. 5 is a circuit diagram of a duty cycle correction amplification circuit according to another embodiment of the present invention.

Another exemplary embodiment of the invention is shown in FIG. 5. Here, a duty cycle correction amplification circuit 200, very similar to duty cycle correction amplification circuit 100 of FIG. 2, is illustrated. However, a first amplifier 210 and a second amplifier 220 are different from first amplifier 110 and second amplifier 120 of FIG. 2 only in that first amplifier 210 responds to the reference signals VREF and VREFB through PMOS differential (first) input transistors 211 and 213, and generates first and second preliminary signals VPRE and VPREB. Second amplifier 220 generates an amplified output signal VOUT based on the first and second preliminary signals VPRE and VPREB through NMOS differential (second) input transistors 221a and 221b. A duty cycle corrector 230 and a feedback buffer 240 of FIG. 5 are similar to duty cycle corrector 130 and feedback buffer 140 of FIG. 2.

Therefore, the construction and operation of duty cycle correction amplification circuit 200 shown in FIG. 5 may be easily understood by those skilled in the art by referring to the former description of duty cycle correction amplification circuit 100 of FIG. 2.

In the above-described exemplary duty cycle correction amplification circuits, a duty cycle corrector is connected to first and second internal signals. Therefore, voltage levels of the first and second preliminary signals are maintained at higher levels than those in conventional duty cycle correction amplification circuits, thus improving the operation of MOS differential input transistors in an associated first amplifier. Therefore, a duty cycle correction amplification circuit according to embodiments of the present invention enjoy the advantages of stable operating characteristics for the first amplifier at a low voltage, decreased load capacitance for the first and second preliminary signals, and improved overall operating characteristics for the duty cycle correction amplification circuit.

Although the present invention has been described in the context of several embodiments, those skilled in the art will appreciate that various modifications, additions and substitutions are possible, without departing from the scope of the invention as defined by the accompanying claims.

What is claimed is:

1. A duty cycle correction amplification circuit, comprising:
   a first amplifier comprising dual first MOS differential input transistors gated respectively by first and second reference signals, and adapted to generate first and second preliminary signals;
   a second amplifier comprising;
      a driving unit comprising dual second MOS differential input transistors respectively gated by first and second preliminary signals, and adapted to generate first and second internal signals in response to the first and second preliminary signals; and
      a load unit connected to the driving unit and adapted to receive the first and second internal signals and act as a load to the first and second internal signals; and
   a duty cycle corrector adapted to correct a duty cycle associated with the first and second internal signals, wherein at least one of the first and second internal signals comprises an amplified output signal having a corrected duty cycle.

2. The duty cycle correction amplification circuit of claim 1, wherein the dual first MOS differential transistors are NMOS transistors and the dual second MOS differential transistors are PMOS transistors.

3. The duty cycle correction amplification circuit of claim 1, wherein the dual first MOS differential transistors are PMOS transistors and the dual second differential MOS transistors are NMOS transistors.

4. The duty cycle correction amplification circuit of claim 1, wherein the duty cycle corrector comprises first and second variable current sources adapted to respectively supply current to the first and second internal signals.

5. The duty cycle correction amplification circuit of claim 1, further comprising:
   a feedback buffer adapted to buffer the amplified output signal.

6. The duty cycle correction amplification circuit of claim 5, wherein the feedback buffer comprises:
   a buffering component adapted to buffer the amplified output signal; and
   coupling component adapted to feedback couple the amplified output signal to the buffering component.

7. The duty cycle correction amplification circuit of claim 6, wherein the coupling component comprises a resistor.

8. The duty cycle correction amplification circuit of claim 6, wherein the buffering component comprises an inverter.

9. A duty cycle correction amplification circuit, comprising:
   series connected first and second amplifiers, each comprising dual MOS differential input transistors, and collectively adapted to generate first and second internal signals defining an amplified output signal in response to received first and second reference signals; and,
   a duty cycle corrector connected in series with the second amplifier, adapted to act as a load for the first and second internal signals, and further adapted to correct the duty cycle of the amplified output signal.

10. The duty cycle correction amplification circuit of claim 9, wherein the dual MOS differential transistors in the first amplifier are NMOS transistors and the dual MOS differential transistors in the second amplifier are PMOS transistors.

11. The duty cycle correction amplification circuit of claim 9, wherein the dual MOS differential transistors in the first amplifier are PMOS transistors and the dual MOS differential transistors in the second amplifier are NMOS transistors.

12. The duty cycle correction amplification circuit of claim 9, wherein the duty cycle corrector comprises first and second variable current sources adapted to respectively supply current to the first and second internal signals.

13. The duty cycle correction amplification circuit of claim 9, further comprising:
   a feedback buffer adapted to buffer the amplified output signal.

14. The duty cycle correction amplification circuit of claim 13, wherein the feedback buffer comprises:
   a buffering component adapted to buffer the amplified output signal; and
   coupling component adapted to feedback couple the amplified output signal to the buffering component.

15. The duty cycle correction amplification circuit of claim 14, wherein the coupling component comprises a resistor.

16. The duty cycle correction amplification circuit of claim 14, wherein the buffering component comprises an inverter.

17. A duty cycle correction amplification circuit, comprising:
   a first amplifier comprising dual first MOS differential input transistors gated respectively by first and second reference signals, and adapted to generate first and second preliminary signals;
   a second amplifier comprising dual second MOS differential input transistors respectively gated by first and second preliminary signals and adapted to generate first and second internal signals; and
   a duty cycle corrector adapted to correct a duty cycle associated with the first and second internal signals and further adapted to supply variable current to the first and second internal signals in response to the first and second preliminary signals, wherein one of the first and second internal signals comprises an amplified output signal having a corrected duty cycle.

18. The duty cycle correction amplification circuit of claim 17, further comprising:
   a feedback buffer adapted to buffer the amplified output signal.

19. The duty cycle correction amplification circuit of claim 18, wherein the feedback buffer comprises:
   a buffering component adapted to buffer the amplified output signal; and
   coupling component adapted to feedback couple the amplified output signal to the buffering component.

* * * * *